United States Patent [19]

Kawakami

[11] 3,737,802

[45] June 5, 1973

[54] MICROWAVE OSCILLATOR WITH MULTIPLE GUNN DIODES IN A CAVITY RESONATOR

[75] Inventor: Kenneth Nobuo Kawakami, Thousand Oaks, Calif.

[73] Assignee: Litton Systems, Inc., San Carlos, Calif.

[22] Filed: Nov. 12, 1971

[21] Appl. No.: 198,287

[52] U.S. Cl. .................................331/96, 331/107 G
[51] Int. Cl. ................................................H03b 7/14
[58] Field of Search ......................331/55, 56, 96, 97, 331/107 R, 107 G, 107 T

[56] References Cited

UNITED STATES PATENTS

| | | | |
|---|---|---|---|
| 3,571,750 | 3/1971 | Carlson et al. | 331/56 X |
| 3,252,112 | 5/1966 | Hauer | 331/56 X |
| 3,509,478 | 4/1970 | Thim | 331/107 G X |
| 3,659,223 | 4/1972 | Mawhinney | 331/56 X |

*Primary Examiner*—Roy Lake
*Assistant Examiner*—Siegfried H. Grimm
*Attorney*—Ronald M. Goldman, Alan C. Rose and Alfred B. Levine

[57] ABSTRACT

A solid state oscillator of a novel and inexpensive construction incorporates a plurality of microwave energy generating diodes, suitably Gunn diodes, for providing output powers in excess of that obtainable from a single diode. More particularly, the oscillator includes a rectangular waveguide type transmission line with a short circuit termination at one end. One or more pairs of diodes are located within the hollow of the waveguide; each diode of a given pair is geometrically arranged to be coupled between opposite ends of a cylindrical metal post and a respective top wall and bottom wall of the waveguide. A bias source is applied to the diodes by connection through a side wall to the metal post and to the waveguide. Microwave energy output coupling means, such as a waveguide, is connected to the open end of the waveguide.

23 Claims, 5 Drawing Figures

DIODE COMBINER CIRCUIT

AVERAGE COMBINING EFF. 100.00%
RANGE = 87.5% @ 7.8 GHz TD 109% @ 8.6 GHz
ELECTRICAL EFF. = 2.5% @ 8.55 GHz

MICROWAVE OSCILLATOR WITH MULTIPLE GUNN DIODES IN A CAVITY RESONATOR

FIELD OF THE INVENTION

This invention relates to high power solid state semiconductor microwave oscillators and, more particularly, to those microwave oscillators in which a plurality of microwave diodes, such as Gunn diodes, concurrently generate microwave energy.

BACKGROUND OF THE INVENTION

Given a device, such as a Gunn diode, capable of generating a certain level of microwave power, one obvious technique used for obtaining microwave energy of higher power levels is to operate a plurality of those devices concurrently, obtaining a total power output which is greater than the power outputs supplied individually from any one device in the plurality. Multiplying sources in that manner provides a practical alternative, in many instances, to the further research and development necessary, and sometimes long forthcoming, in order to obtain an improved individual device capable of individually furnishing the desired higher power levels. In so multipling the outputs of numerous microwave sources in an oscillator, the oscillator structure must ensure that any one microwave energy source oscillates at the same frequency and phase as any other source in the oscillator. While numerous complex control circuits, both active and passive in operation, appear in the prior art which accomplish the foregoing ends for vacuum tube and transistor sources, such complex circuits appear unnecessary for oscillators which employ Gunn diodes or other solid state semiconductor diodes as the microwave energy source.

One current design for such a microwave oscillator in which multiple Gunn diodes are employed appears in the 1971 *IEEE G-MTT International Microwave Symposium Proceedings*, commencing at page 156, which describes a "Multi-parallel Operation of Gunn Diodes for High RF Power", by Kaneko et al. In that oscillator a plurality of diodes are individually coupled between the bottom and top walls of a waveguide. The microwave energy that is generated by the diodes is coupled in parallel to a waveguide output. In a modification of that oscillator structure, two parallel metal waveguide structures are employed with the waveguides having a metal wall in common. Two diodes are individually connected in circuit between the top and the bottom (common) wall of one respective waveguide portion and two additional diodes are individually connected in circuit between the top (common) wall and bottom wall of the second waveguide portion and all four diodes are located in a common plane perpendicular to the axis of the waveguides. The output of the two individual waveguides is coupled into a common waveguide transmission line by means of a tapered waveguide section. In still additional embodiments multiples of these four diodes are employed at various positions along the waveguide structure. This arrangement is referred to in the publication as a "multiparallel operation". Although that structure demonstrates the feasibility of using diodes in multiple to obtain increased power levels and at a single frequency, it is unnecessarily complicated. First, a complicated choke and feed-through arrangement is used to supply the bias voltages to the diodes. Thus one terminal of the diode is maintained insulated from the waveguide wall and a choke type connector with an RF filter is connected between the ungrounded terminal of the diode and the bias supply. Secondly, the use of a multiwaveguide structure results in a physically larger and more complex structure than is desired.

Another construction in which microwave energy generating diodes, suitably IMPATT diodes, are placed in multiple to achieve larger output powers is illustrated and described in the January 1971 issue of the *Proceedings of the IEEE*, pages 102 and 103, entitled "An X-Band 10-Watt Multiple-IMPATT Oscillator", Kurokawa and Magalhaes. In that structure each of the diodes is placed at one end of a corresponding one of a plurality of coaxial lines in contact with the line center conductor and a microwave absorber is placed at the ends of each coaxial line. The coaxial lines are spaced apart from one another and mounted in the side walls of a larger resonator cavity and each coaxial line is open along a side to permit microwave energy to pass into the resonator. The author's design is stated to be based initially by analogy upon a preceding successful transistor design of seemingly simple construction. Unfortunately because of the differences in characteristics between transistors and microwave diodes, a simple substitution was not possible and the diodes did not operate in phase and were susceptible to frequency instability. While the circuit described cures those problems, physically it appears too complex and is obviously more complex than the design of the parent transistor oscillator structure.

OBJECTS OF THE INVENTION

Accordingly, it is an object of my invention to provide a high power solid state microwave oscillator of novel and simple construction.

It is another object of my invention to provide a multiple diode microwave oscillator of a construction that is smaller in size and weight and of lesser complexity than those heretofore available.

It is a further object of my invention to provide a multiple microwave energy generating diode oscillator which avoids "moding" and in which the diodes operate in phase.

It is still another object of my invention to provide a novel oscillator unit by which bias voltages may be connected to a plurality of diodes without the use of expensive, space consuming and complicated chokes or filters.

And it is an additional object of my invention to provide a multiple Gunn diode solid state oscillator in which the output power obtained from multiple diodes is in instances greater than the sum of the individual output powers obtained individually from each diode in the circuit.

BRIEF SUMMARY OF THE INVENTION

The oscillator includes a rectangular metal waveguide of a predetermined length; a short circuit termination at one end and open passage at the other end of the waveguide; at least one pair of Gunn diodes or other suitable microwave energy generating diode is mounted within the waveguide between the top and bottom waveguide walls in a mechanical series arrangement of Gunn diode, a metal cylindrical post, and the second Gunn diode. Suitably the cylindrical post is of a height less than the height dimension of the waveguide. The upper Gunn diode has its negative polarity terminal electrically in contact with the upper waveguide wall and its positive polarity terminal electrically in contact with the upper end of the cylindrical post. The lowermost diode has its negative polarity terminal electrically in contact with the bottom wall of the waveguide, which thereby places same in common electrically with the negative terminal of said first diode, and this second diode has its positive polarity terminal electrically in contact with the bottom end of said cylindrical post, to thereby place same electrically in common with the positive terminal of said first diode.

In accordance with my invention, one polarity output of a bias source is connected in electrical circuit with said cylindrical post and the remaining polarity terminal of the source is connected electrically in common with said metal waveguide to place the bias on the diodes.

Suitably, in accordance with another aspect of my invention, a like series arrangement of an additional pair of Gunn diodes and cylindrical post is placed spaced from the preceding pair of diodes and in a common plane perpendicular to the waveguide with the former to provide a total of four diodes in multiple. In like manner, additional pairs of diodes and intermediate posts may be placed at different locations along the length of the waveguide.

Suitably, in accordance with that modification of the invention, the electrically conductive posts are placed electrically in common by means of multiple connections to the bias source or, alternatively, by an electrical connection internally of the waveguide between cylindrical posts.

In accordance with another aspect of the invention, the bias source is coupled in circuit to the conductive post by means of an electrically conductive lead which extends through an insulated passage in a side wall of the waveguide.

Further in accordance with the invention, the short circuit termination is positionable to different positions along the length of the waveguide and comprises a stub tuner so as to increase or decrease effectively the distance between the diodes and the short circuit terminations and in that manner change the electrical impedances reflected to the diodes.

The foregoing objects and advantages of my invention together with additional advantages, the elements comprising a preferred embodiment of my invention and their functional relationship to one another together with substitutions and equivalents therefor, are better understood from a consideration given to the detailed description of a preferred embodiment of the invention which follows, considered together with the figures of the drawings.

DETAILED DESCRIPTION OF THE INVENTION

Figure 1:
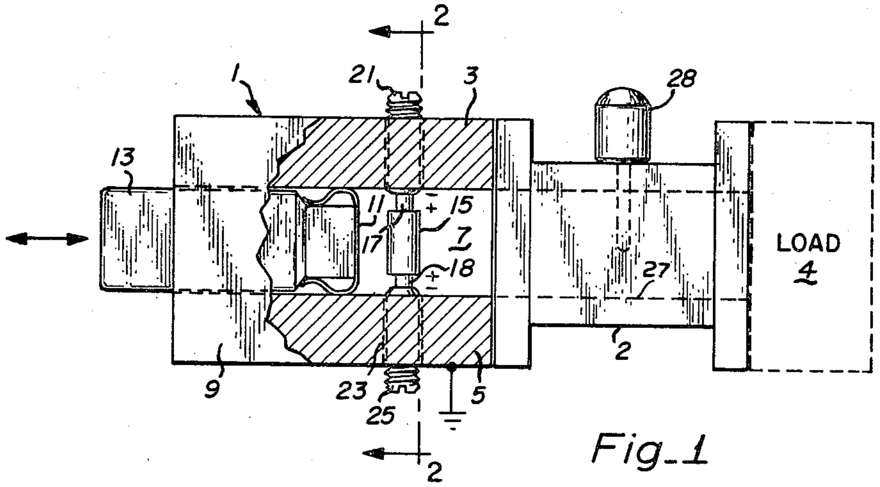
FIG. 1 illustrates a side view of a preferred embodiment of the oscillator of the invention.

In FIG. 1 the oscillator structure 1 is shown coupled to a waveguide transmission line 2 and the output of the line to an electronic load symbolically indicated by dash lines 4. Mechanically the main body of the oscillator is a hollow rectangular metal body, suitably a thick walled rectangular metal waveguide. The waveguide is a section of commercially available rectangular metal waveguide structure, alternatively, or is of a specially fabricated assembly of metal plates fastened together with screws, either of which is conventional. The internal height nd width dimensions selected for the rectangular waveguide passage are those dimensions conventionally chosen for the frequency band of interest. For example, in the frequency range between 8 and 12.4 GHz, referred to as X-Band, the internal width and height dimensions are typically 0.9 inches in width by 0.4 inches in height. Waveguide 1 includes a top wall 3, a bottom wall 5, a first side wall 7, and a front side wall 9. A portion of side wall 9 is illustrated cutaway to expose the internal elements and their relationship to one another. The waveguide as well as the inner wall surfaces are of an electrically conductive metal, typically copper.

An electrically conductive wall 11 or short circuit termination provides a boundary at the rear of the waveguide passage. Suitably the wall contains conventional spring fingers to ensure electrical contact with the walls of the waveguide.

A plug 13 of any solid material, suitably metal or dielectric, is connected to movable wall 11 and provides a grippable surface. Plug 13 is slidably mounted within the passage formed in the waveguide. Thus wall 11 may be transversely adjusted in position in the passage along the length of the waveguide. The movable wall provides an electrical short circuit termination for the waveguide passage, viewed as a transmission line, and determines the effective length of the waveguide transmission line between end wall 11 and the front end of the waveguide and the diodes, as is hereinafter discussed.

An electrically conductive cylindrical metal post 15, suitably copper, is located proximate the front end of the waveguide and spaced from and parallel to the side walls of the waveguide. The cylindrical post is shorter in height than the height dimension of the inner waveguide for obvious reasons. A first Gunn diode 17 is connected with its positive polarity terminal in abutment with the top end of post 15 and a second Gunn diode 18 is located within the waveguide passage with its positive polarity terminal in contact and abutting the bottom end of post 15.

The upper wall 3 of the waveguide includes a tapped passage therethrough axially aligned with post 15, and an electrically conductive metal screw 21, suitably copper, is inserted within that passage. Screw 21 is electrically in contact with the metal waveguide, extends through wall 3, and is screwed in to a depth so that its tip end is in contact with the negative polarity terminal of Gunn diode 17. A like tapped passage is included in bottom wall 5 of the waveguide axially aligned with post 15 and screw 21. An electrically conductive metal screw 25 is inserted within the passage, extends through all 5, and is screwed into the passage so that its tip end abuts the negative polarity of Gunn diode 18. The screws serve to mechanically clamp the diodes and post in the illustrated position. By way of example, post 15 is approximately 0.16 inch in diameter and 0.3 inch in height, diodes 17 and 18 are each approximately 0.02 inch thick and each of the screws protrude into the passage by about 0.03 inch.

The aforedescribed arrangement of the diodes and post may be referred to as a mechanical series assembly of diode and metal post and diode between the top and bottom waveguide walls. Obviously with refined fabrication techniques and attention to close dimensional tolerances, the diodes could abut the walls directly and the screws could be eliminated.

Figure 2:
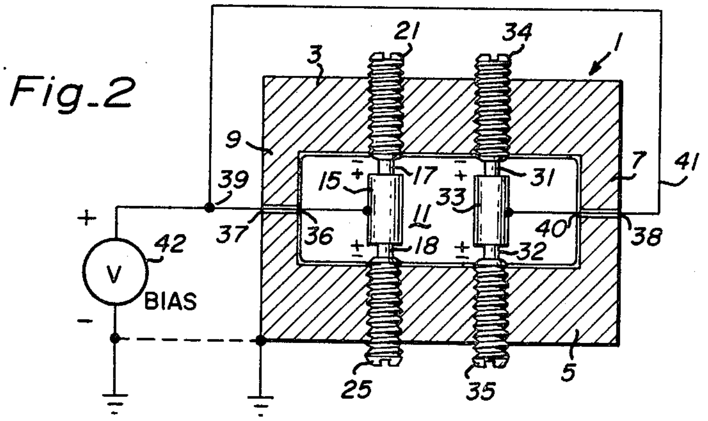
FIG. 2 illustrates a cross-section of the embodiment of FIG. 1 taken along the lines 2—2.

Not visible in this figure and located in the same plane and the same distance from the front end of the waveguide is an additional mechanical series arrangement of diode and metal post and diode immediately behind that of 17, 15 and 18, which is better illustrated in FIG. 2.

A microwave transmission line 2, suitably a rectangular waveguide, is connected between the output of the oscillator at the front end of the waveguide 1 and a matched load 4 indicated by the dashed lines in the figure. The internal walls of waveguide 27 which "guides" the microwave energy are illustrated by the dash lines. In one embodiment, a tuning paddle or knob 28, commonly known as a slide screw tuner, is located as part of this waveguide section. In another embodiment, a conventional fixed iris or tuned window, is positioned at front end of waveguide 1.

FIG. 2 illustrates a cross section of the embodiment of FIG. 1 taken along the lines 2—2 of FIG. 1 which is in a plane perpendicular to the surface of the drawings. The top wall 3, bottom wall 5, side walls 7 and 9 of the waveguide are illustrated, as well as conductive rear wall 11.

The mechanical series arrangement of diode 17, conductive post 15, and diode 18 between adjusting screws 21 and 25 is better illustrated in this figure. Spaced from the first described mechanical series arrangement and side wall 7 is a second mechanical series arrangement of diode 31 and electrically conductive metal post 33 and diode 32 located in between electrically conductive metal screw 34 mounted in the upper wall 3 of the waveguide and electrically conductive metal screw 35 mounted in the lower wall 5 of the waveguide. This second mechanical series arrangement of diode post and diode is assembled together in the same manner as the first. Hence both diodes 31 and 32 have their positive polarity terminals abutting and in contact with the top and bottom ends, respectively, of post 33. By way of example, the spacing between the center of cylindrical post 15 and inside of all 9 is 0.25 inch, and the spacing between center of cylindrical post 33 and the inside of wall 7 is 0.25 inch also and, preferably, these spacing distances are the same. This provides a center-to-center spacing between the posts of approximately 0.4 inch.

A first small passage 37 is formed in and extends through side wall 9 and a like second small passage 38 is formed in and extends through side wall 7, suitably in the same plane as that containing the mechanical series arrangements of diode post and diode. The passages are small in relation to the wavelength of the oscillator frequency, suitably 1/20th $\lambda$ in diameter, to avoid microwave energy leakage. Electrical leads 39 and 41 extend external of the cavity through the respective passages and are connected, suitably soldered, to a respective one of the cylindrical posts 15 and 33, as illustrated in the figure. Preferably the passages are located midway between the upper and lower inner walls of the waveguide and the electrical leads are stiff and self-supporting so that they are positioned in a straight line between the passage and midpoint of the corresponding post. The leads are electrically insulated from respective walls by a suitable insulating material on either the leads, the passage walls, or both. Insulators 36 and 40 are illustrated in passages 37 and 38. A source 42 of Gunn diode bias voltage, symbolically illustrated, and suitably 10 volts, is connected in common to each of the electrical leads and to electrical ground. The waveguide of the oscillator structure is also connected to electrical ground. This completes an electrical bias path for each pair of diodes in the first and second mechanical series arrangement as follows: from the positive polarity terminal of the bias source to conductive post 15 and to the corresponding positive polarity terminal of the respective diodes 17 and 18; from the negative polarity terminal of the bias source through electrical ground to the walls of the waveguide, and electrically in common through the metal screws 25 and 21 to the negative polarity terminal of the respective diodes 18 and 17.

As is apparent from the figure, a corresponding electrical path exists via lead 41 and ground from the positive and negative polarity terminals of the bias source to the conductive post 33 and screws 34 and 35 in the waveguide walls.

An obvious alternative to the separate and individual connections between bias source 42 and conductive posts 15 and 33 can be as follows: by connecting a wire between post 15 and 33, electrical lead 41 as well as passage 38 may be eliminated from this embodiment.

Figure 3:
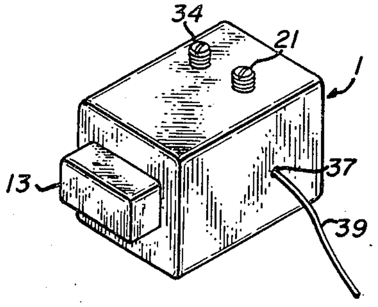
FIG. 3 illustrates in perspective the outer geometry of the oscillator package such as used in the embodiment of FIGS. 1 and 2.

A perspective view of an oscillator unit constructed according to the invention is provided in FIG. 3 which shows a mechanically simple arrangement consisting essentially of waveguide 1, the end of tuning plunger 13, screws 21 and 34 which, as is apparent, may be made of shorter length so as to be recessed in the waveguide wall, electrical lead 39, and passage 37. The remaining electrical lead 41 as well as passage 38 and screws 25 and 35 are not visible in this figure. Obviously further refinements can be made to further simplify the external geometry of the unit.

In operation, the bias source 42 is operated and bias currents and voltages are applied to each of the four Gunn diodes, 17, 18, 31 and 32. As is well known and conventional, the Gunn diodes exhibit a negative resistance characteristic when properly biased into the negative resistance range by the bias source. The waveguide transmission line formed within the waveguide body of oscillator 1 is terminated by a short circuit termination, the metal surface 11.

As is conventional and well known, a short circuited transmission line exhibits characteristic properties of electrical capacitance and inductance in kind and amounts dependent upon the length of the line (distance to the short circuit termination) and is conventional as a frequency determining circuit in types of oscillators.

The frequency determining cavity of the oscillator is formed in that section of waveguide bounded by the moveable short and the plane containing the Gunn diodes. The length of this section, in the usual mode of operation, is a half wavelength. Thus at one frequency where the length of the short-circuited transmission is effectively one-half wavelength long as presented to the diodes, the a.c. impedance at that frequency is very low, essentially a short circuit, the line represents a resonator of equal inductive and capacitive reactances. The Gunn diode is a low impedance device and it effectively couples to the resonator. The frequency of oscillation is, to a large extent, adjustable by means of the moveable short circuit termination, wall 11. This is adjusted until in the specific example given the output frequency is of the desired one within X-Band. The slide screw tuner 28 matches the load to the Gunn diodes for the purpose of optimizing the oscillator efficiency to obtain the maximum possible power output. It has a second order effect on frequency (which is primarily determined by the position of the moveable short) although the output microwave power can be increased considerably. This is adjusted by conventional procedures with suitable test equipment to obtain maximum power output. A properly placed iris of conventional structure is often used to achieve the same effect. The microwave energy generated is passed through the waveguide transmission line 27 in FIG. 1 to load 4. The electrical load may be, as an example, an amplifier or other stage of a conventional radar receiver.

It is found that in this circuit, the attainment of four diodes locking together at the same frequency in phase coherency is easily attained. This is a common phenomenon referred to as "injection locking" whereby an externally generated signal influences a given diode so that it oscillates at the same frequency and is in phase coherency with the externally applied signal.

Moreover, since electrical leads 39 and 41 extend through to the center conductor along a route where the electric fields are minimal, the coupling of the electric fields to leads 39 and 41 is, accordingly, minimal. Hence it becomes unnecessary to install complex RF chokes or filters for the purpose of minimizing RF leakage through the bias leads.

Inasmuch as the diodes are mechanically in contact with screws in turn mounted to the broad waveguide walls, it is apparent that a thermal path from the diode permits the waveguide wall function as a large heat sink to dissipate heat generated in the diode.

Figure 4:
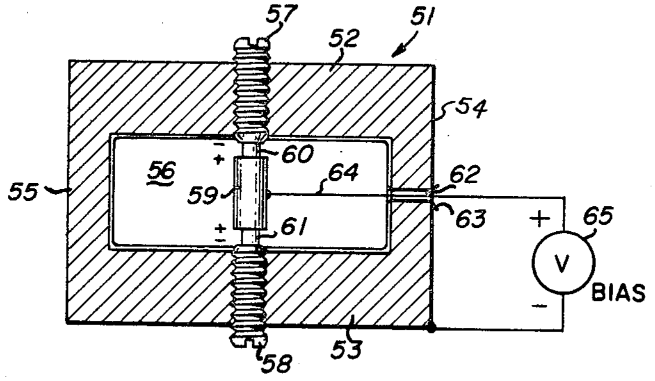
FIG. 4 illustrates a section of another embodiment of my invention.

Although four diodes are used in the preferred embodiment of FIGS. 1 through 3, for lesser power levels a two diode arrangement can be used, such as is illustrated by the cross-sectional schematic of FIG. 4.

FIG. 4 shows a waveguide body 51 having a top wall 52, a bottom wall 53, side walls 54 and 55, and a back wall 56. Back wall 56 may comprise a moveable short such as is employed in the preferred embodiment of FIG. 1. A first screw 57 is inserted into a threaded passage in waveguide wall 52 and a second screw 58 is inserted in a tapped passage in bottom wall 53. The passages in the top and bottom waveguide walls are axially aligned and are located preferably closer to the side wall through which the bias lead goes through. A cylindrical electrically conductive metal post 59, a first Gunn diode 60, and a second Gunn diode 61 form a mechanical series arrangement clamped together essentially by the metal screws 57 and 58. Gunn diode 60 has its positive polarity terminal in contact with the upper end of cylinder 59 and its negative polarity terminal in contact with screw 57 which places that terminal electrically in common with waveguide 51. Gunn diode 61 also has its positive polarity terminal in contact with the bottom end of cylinder 59 and its negative polarity terminal in contact with metal screw 58 which places the negative polarity terminal of the diode in common with the bottom wall 53 of the waveguide. A passage 62 is located in side wall 54. This passage includes preferably a Teflon insulator 63. An electrical lead 64 is connected at one end to the mid-point of conductive cylinder 59. Lead 64 extends through insulated passage 62 and external of waveguide 51. A bias source 65, suitably of 10 volts, has its positive polarity terminal connected to the external end of lead 64 and its negative polarity terminal connected to waveguide 51.

As in the case of the preceding embodiment of the invention, a bias voltage circuit is completed between the waveguide post and the waveguide and is applied across each of diodes 60 and 61. The mode and manner of operation of this embodiment of the invention is the same as that in FIG. 2. Inasmuch as there are only two Gunn diodes employed in this embodiment, the obtainable output power would essentially be about half of that obtainable from the embodiment of FIG. 2 which employs four diodes.

Additional modifications to the invention are apparent. For example, it is possible to add another pair of mechanical series arrangements employing four additional diodes in the embodiment of FIG. 1 by adding same at a location along the length of the waveguide 3 spaced preferably a half wavelength from that location in which diodes 17 and 18 are located. Such a further modification would include eight diodes and is capable essentially of providing double the output power as that obtained from FIG. 1.

In one specific example of the embodiment of FIG. 2, each of the individual diodes was operated separately. In such a test, diode 17 was biased at 8 volts, drew 550 milliamps current, and provided 48 milliwatts output at a frequency of 9.2 GHz. Diode 18 with the same bias voltage drew 470 milliamps and provided a power output of 44 milliwatts at a frequency of 8.5 GHz. Diode 31 biased at 8 volts drew 550 milliamps and provided a power output of 56 milliwatts at 10.0 GHz. And diode 32 biased at 8 volts drew 550 milliamps and provided a power output of 69 milliwatts at 9.4 GHz. Operating all four diodes simultaneously in the oscillator structure of FIG. 2 and providing a bias voltage of 8 volts, a current of 2.1 amps was drawn and a power output of 320 milliwatts was obtained at a frequency of 9.2 GHz. Curiously and rather surprisingly, the total output power of 320 milliwatts far exceeds the output power obtained from the individual diodes which sums to 217 milliwatts. The diodes were definitely injection locked to each other and operated at 9.2 GHz with minimal noise and no detectable spurious signals.

In a second test using different diodes, the following was obtained:

Diode 17:
8.6 volts
0.96 amps
9.2 GHz
140 milliwatts

Diode 18:
8.9 volts
1.070 amps 8.6 GHz
135 milliwatts
Diode 31:
8.9 volts
1.070 amps
8.6 GHz
135 milliwatts
Diode 32:
8.0 volts
1.090 amps
9.6 GHz
180 milliwatts Biasing the configuration at 10.5 volts, at 4.0 amps, an output power of 990 milliwatts was obtained at a frequency of 8.34 GHz. This contrasts surprisingly with the sum of the power outputs obtained by operating the four diodes individually and which amounts to 590 milliwatts.

Figure 5:
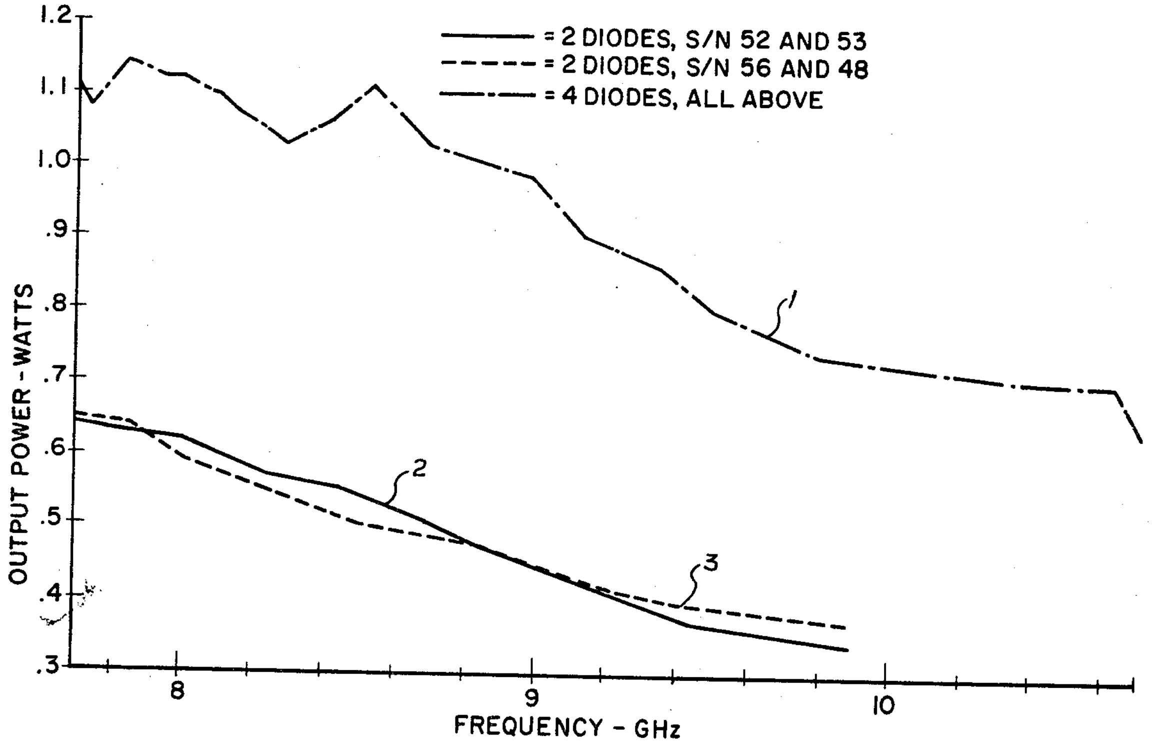
FIG. 5 is a graph that illustrates the results of one specific example constructed in accordance with the embodiment of FIG. 1.

The graph of FIG. 5 illustrates the results obtained in an embodiment in which the movable short 11 is located at 0.334-inch from the plane containing the four diodes over a frequency range of approximately 7.5 to 10.5 GHz. Curve 1 illustrates the output power as compared to frequency in which the four diodes are simultaneously operated. Curve 2 illustrates the power output versus frequency obtained using the same configuration and in which the bias source is removed from diodes 31 and 32 so they do not contribute to output power. Conversely, curve 3 represents the output power versus frequency characteristic of the oscillator of FIG. 2 in which the bias source is removed from diodes 17 and 18 so that diodes 17 and 18 do not contribute to the output power.

It is noted that at a frequency of 8 GHz, diodes 17 and 18 alone operating provided a power output of 0.6 watts. Diodes 31 and 32 in operation provided a power output of 0.62 watts. The output power at this frequency with all four diodes in operation provided an output power of 1.12 watts for a conversion efficiency of approximately 91.7 percent. By contrast, at a frequency of approximately 8.5 GHz, diodes 17 and 18 provided an output power of 0.5 watts. Diodes 31 and 32 provided a power output of 0.55 watts and with all diodes in operation, an output power of 1.09 watts was obtained for a conversion efficiency greater than 100 percent.

Although specific details are disclosed in this specification in connection with my description of the preferred embodiments of my invention, it is understood that such details have been presented by way of explanation and example in order to clearly disclose to one skilled in the art how to make and use the invention. Obviously such details have not been presented by way of limitation to my invention inasmuch as many equivalents to and substitutions for those elements become apparent to one of ordinary skill in the art upon reading this specification, and all such substitutions, equivalents, modifications and improvements are clearly understood to be within the spirit and teaching of my invention.

For example, a different means of changing the frequency of oscillator is also apparent and requires a slight modification: A threaded hole may be located in the waveguide between, preferably centered between, the short circuited end wall and the plane of the Gunn diodes and a screw formed of dielectric material, suitably Teflon, Rexolite, or equivalent, is screwed into the hole and extends into the waveguide passage. The depth of insertion of the dielectric of the screw into the waveguide passages affects the electrical characteristics of the waveguide as seen by the Gunn diodes and hence the frequency of oscillation of the unit. Essentially, the greater the length of dielectric material inserted into the waveguide, the lower the frequency of oscillation. With such a modification, the position of the short circuit end wall can be retained or formed fixed in position. And the short circuiting end wall need not be used for tuning the oscillator.

Then too, conventional electrical connectors may be installed on the oscillator to provide feedthrough or current path into the waveguide. Hence, the bias leads would have suitable connector portions installed.

Additionally, the Gunn diode is used as the preferred diode in the construction of the preceding embodiments of the invention. Inasmuch as the Gunn diode is one member of the class of semiconductor diodes which exhibits a negative resistance characteristic, which diodes I have termed "microwave energy generating diode", it is apparent that other available diode types, including IMPATT diodes, can be substituted for the Gunn diode as an obvious modification. Additionally, as pointed out in the preceding description, the Gunn diode has a positive polarity terminal and negative polarity terminal (in the sense that operation occurs when the diode terminals are connected to like polarity terminals of a bias supply) which are to be connected to the respective corresponding positive and negative polarity terminals of the bias voltage supply. In the preceding embodiments, the negative terminals of the diode are illustrated connected to the post. However, by reversing the orientation of all the diodes so that the positive terminal is connected to the post and reversing the connections between the power supply so that the positive polarity terminal is connected to the post another obvious modification is obtained. Thus to complete a proper connection between the diode terminal of one polarity requires that it be connected in circuit with a bias source output terminal of the corresponding electrical polarity. Still further modifications are within the scope of my invention: The diode terminal directly abuts the conductive post in the preceding embodiments of the invention. It is equally possible to insert electrically conductive spacers between the end of the post and the diode terminal or, in fact, in more sophisticated versions to add a diode socket to the ends of the conductive post. Thus, although direct contact is preferred as illustrated in the preferred embodiments, other less direct but conventional means can be included so that the diode terminals are placed electrically in common with the corresponding elements of the oscillator as prescribed earlier in this specification.

Accordingly it is expressly understood that my invention is to be broadly construed within the full breadth and scope of the appended claims.

What I claim is:

1. A solid state oscillator comprising:

means forming a hollow rectangular waveguide passage, said waveguide passage being bordered by opposed top and bottom walls and opposed right and left side walls, said walls being of electrically conductive material and electrically in common;

a terminating back wall for terminating said waveguide passage to microwave energy;

first and second Gunn diodes located in said passage spaced from said back wall, each of said Gunn diodes containing a first terminal of a first polarity and a second terminal of a second polarity;

a post of electrically conductive material located in said passage spaced from said walls, said post having a predetermined height between its first and second ends less than the distance between said top and bottom walls of said waveguide passage and a maximum thickness dimension no more than one-quarter of the distance between said right and left side walls;

said first Gunn diode positioned at said first end of said post having its first terminal electrically in common with said first end of said post and having its second terminal electrically in common with said top wall of said waveguide passage;

said second Gunn diode positioned at said second end of said post and having its first terminal electrically in common with said second end of said post and having its second terminal electrically in common with said bottom wall of said waveguide passage; whereby said corresponding first terminals of each diode are electrically in common and said corresponding second terminals of each diode are electrically in common;

said first diode, said second diode, and said post being aligned substantially along a common axis to form a mechanical series arrangement, said common axis oriented substantially parallel to said side walls and perpendicular to said top and bottom walls and located at a predetermined position along the length of said waveguide passage spaced from said terminating back wall;

a third and fourth Gunn diode located in said passage spaced from said back wall, each of said third and fourth Gunn diode having a first terminal of a first polarity and a second terminal of a second polarity;

a second post of electrically conductive material spaced from said first post, said second post having a predetermined height between its first and second ends less than the distance between said top and bottom walls and a maximum thickness no more than one-quarter the distance between said right and left side walls;

said third Gunn diode positioned at said first end of said second post having its first terminal electrically in common with said first end of said second post and having its second polarity terminal electrically in common with said top wall of said waveguide passage;

said fourth Gunn diode positioned at the second end of said second post and having its first terminal electrically in common with said second end of said second post and having its second terminal electrically in common with said bottom wall of said waveguide passage;

said third and fourth Gunn diodes and said second post being aligned substantially along a common axis to form a mechanical series arrangement, said common axis oriented substantially parallel to said side walls and perpendicular to said top and bottom walls and located at the same predetermined position along the length of said passage as said common axis of said first mechanical series arrangement;

microwave energy coupling means connected to an end of said waveguide passage spaced from said diodes and remote from said back wall for coupling microwave energy to a load;

a source of bias voltage for said diodes, said bias source having a first output terminal of a first polarity and a second output terminal of a second polarity;

first electrically conductive means connecting said second output terminal of said source electrically in common with said waveguide walls, and second electrical conductor means connecting said first output terminal to said post;

and third electrical conductor means connecting said second post electrically in common with said first output terminal of said bias source; whereby all four diodes generate microwave frequency energy of the same frequency and phase.

2. The invention as defined in claim 1 further comprising means for selectively positioning said back wall for changing the length of said passage.

3. The invention as defined in claim 2 further comprising a first minute opening in a side wall adjacent said first post and a second minute opening in a side wall adjacent said second post, said openings located in substantially a common plane with said common axes of said mechanical series arrangements and approximately midway between said top and bottom walls; and wherein said second electrical conductor means includes a substantially straight portion which extends between said first opening and said first post and wherein said third electrical conductor means includes a straight portion which extends between said second opening and said second post; whereby coupling of microwave energy from said passage to said bias supply is minimized.

4. The invention as defined in claim 1 further comprising first and second electrically conductive screw means, said first screw means coupled to said top wall and at an end abutting said second terminal of said first Gunn diode, and said second screw means coupled to said bottom wall and an end abutting said second terminal of said second Gunn diode, for placing said first terminals electrically in common with said walls and compressively supporting said mechanical series arrangement between said top and bottom walls.

5. The invention as defined in claim 2 further comprising two pairs of screws of electrically conductive material, each pair comprising a first screw coupled through a top wall and a second screw coupled through a bottom wall with the ends of said first and second screws abutting respectively second terminals of said diodes of a mechanical series arrangement to place said second terminals electrically in common and compressively maintain such mechanical series arrangement between said top and bottom walls.

6. A solid state microwave oscillator for generating microwave energy, said oscillator comprising:

a hollow metal waveguide having inner walls of electrically conductive material which border and define a passage of a predetermined height and width;

a terminating metal wall for closing said passage;

first and second microwave energy generating diodes located in said passage, each of said diodes containing a positive polarity terminal and a negative polarity terminal;

a post of electrically conductive material located in said passage and spaced from said inner walls;

said first diode positioned at a first end of said post and having its positive polarity terminal electrically in common with said post;

said second diode positioned at a second end of said post and having its positive polarity terminal electrically in common with said post;

said diodes and post thereby forming an elongated mechanical series structure;

said mechanical series structure being positioned at a predetermined position within and along the length of said passage spaced from said terminating metal wall; and said negative polarity terminal of each respective one of said diodes being placed electrically in contact with a respective corresponding one of two opposed inner wall portions of said inner walls bordering said passage to support said structure therebetween and place said negative polarity diode terminals electrically in common through said inner walls;

third and fourth microwave energy generating diodes located in said passage, each of said diodes containing a positive polarity terminal and a negative polarity terminal;

a second post of electrically conductive material located in said passage and spaced from said inner walls and from said first post;

said third diode positioned at a first end of said second post and having its positive polarity terminal electrically in common with said second post and said fourth diode positioned at a second end of said second post and having its positive polarity terminal electrically in common with said second post to form a second elongated mechanical series structure;

said second mechanical series structure being positioned at the same predetermined position along the length of said waveguide passage as said first mechanical series structure and spaced from said first mechanical series structure along the width of said passage and oriented parallel to said first mechanical series structure; and said negative polarity terminal of each respective one of said third and fourth diodes being placed electrically in contact with a respective corresponding one of two additional opposed inner wall portions of said inner walls bordering said passage to support said second mechanical series structure therebetween and to place said negative polarity diode terminals electrically in common through said inner walls;

microwave energy output means located at an end of said passage remote from said terminating metal wall for coupling microwave energy to a load;

bias source means for said diodes, said bias source means having a positive polarity terminal and a negative polarity terminal;

first electrical conductor means for connecting said negative polarity terminal of said source in circuit with said waveguide walls;

second electrical conductor means for connecting said positive polarity terminal of said source to said post;

and third electrical conductor means for connecting said second post electrically in common with said first post, whereby each of said microwave energy generating diodes provides microwave frequency energy of the same frequency and in phase.

7. The invention as defined in claim 6 further comprising means for adjusting the position of said terminating metal wall along the length of said waveguide whereby the length of said passage may be varied.

8. The invention as defined in claim 6 wherein said microwave energy generating diodes comprise Gunn diodes.

9. The invention as defined in claim 6 further comprising an elongated dielectric member of dielectric material located between said diodes and said terminating metal wall and extending into said waveguide passage, and means to change the depth of extension of said member into said waveguide passage, whereby the oscillator frequency may be changed.

10. The invention as defined in claim 6 wherein said micro-wave energy output means comprises an open end of said passage, said open end being remote from said terminating metal wall.

11. The invention as defined in claim 6 further comprising in combinatinon tuning means coupled to said microwave energy output means for adjusting the voltage standing wave ratio of said oscillator output.

12. The invention as defined in claim 11 wherein said tuning means comprises a paddle.

13. The invention as defined in claim 11 wherein said tuning means comprises a tuned iris window.

14. The invention as defined in claim 6 further comprising:

first and second screw means of electrically conductive material, each said first and second screw means extending through a tapped opening in a corresponding one of said two opposed inner wall portions and having their ends in contact with a corresponding one of said negative terminals of said first and second diodes to ensure compressively supporting said mechanical series structure between said opposed wall portions and an electrical path between said negative terminals through said inner walls; and third and fourth screw means of electrically conductive material, each said third and fourth screw means extending through a tapped opening in a corresponding one of said two additional opposed inner wall portions and having their ends in contact with a corresponding one of said negative terminals of said third and fourth diodes to ensure compressively supporting said second mechanical series structure between said additional opposed wall portions and an electrical path between all negative terminals through said inner walls.

15. The invention as defined in claim 10 wherein each of said post and said second post is of a predetermined length of less than the distance between said opposed inner wall portions of said passage and of a thickness dimension no more than one-quarter of the width of said waveguide passage.

16. The invention as defined in claim 15 wherein one of said posts is spaced from one adjacent inner wall by a predetermined distance, D, and wherein the other one of said posts is spaced from a second adjacent inner wall, opposite to said one adjacent wall, by the same predetermined distance, D.

17. The invention as defined in claim 6 wherein one of said posts is spaced from one adjacent inner wall by a predetermined distance, D, and wherein the other of said posts is spaced from a second adjacent inner wall, opposite to said one adjacent wall, by the same predetermined distance, D.

18. A solid state oscillator comprising:

means forming a hollow rectangular waveguide passage, said passage being bordered by electrically conductive top, bottom, right side and left side walls;

a back wall to terminate said passage to microwave energy;

a plurality of Gunn diodes located in said passage, said plurality comprising a quantity 2N, where N is an even integer, and forming N diode pairs;

each said Gunn diode containing a first terminal of a first polarity and a second terminal of a second polarity;

an even numbered plurality of posts of electrically conductive material, said plurality of posts corresponding in number to one-half said quantity of diodes, (2N/2), and arranged to form N/2 pairs of posts and said posts being located in said passage spaced from each other and from said top, bottom, right side and left side walls and any one post of each pair of posts being spaced from said back wall by the same distance as the other post of said same pair of posts; and with any one post of each pair of posts being spaced from the one of the said side walls most adjacent thereto by the same distance as the other post of said pair of posts is spaced from the other one of the said side wall most adjacent thereto;

said diodes of each pair of Gunn diodes in said plurality being, located at opposite ends of a corresponding one of said plurality of posts, each of said diodes of said pair having its first terminal electrically in common with the adjacent end of a corresponding post to form a plurality of mechanical series structures, said mechanical series structures being located in said passage spaced from said terminating back wall and from one another and each being supported in between said top and bottom walls;

said second polarity terminal of each diode being in contact electrically with said adjacent passage wall, whereby all of said second polarity terminals of said diodes are placed electrically in common;

a source of bias voltages for said diodes, said bias source having a first polarity output terminal and a second polarity output terminal;

means connecting said second polarity output terminal of said bias source electrically in common with said walls, and means placing said first polarity terminal of said bias source electrically in common with each of said plurality of posts.

19. The invention as defined in claim 18 further comprising means for positioning said back wall for changing the length of said passage.

20. The invention as defined in claim 19 wherein each said mechanical series structure is aligned substantially parallel with said side walls.

21. The invention as defined in claim 18 further comprising a plurality of electrically conductive screw means, said plurality corresponding in number to the number of Gunn diodes; a corresponding plurality of tapped passages located in opposed walls of said waveguide aligned with the axis of a corresponding mechanical series structure; each pair of screw means being located in opposed openings and having their ends in contact with said diodes whereby each said mechanical series structure is compressively supported in between said opposed walls and the second polarity terminal of each diode is thereby placed electrically in common with said walls.

22. The invention as defined in claim 18 wherein N comprises 2.

23. The invention as defined in claim 27 wherein the quantity N comprises 2.

* * * * *